(12) United States Patent
Hartemann et al.

(10) Patent No.: US 6,724,782 B2
(45) Date of Patent: Apr. 20, 2004

(54) FEMTOSECOND LASER-ELECTRON X-RAY SOURCE

(75) Inventors: Frederic V. Hartemann, Dublin, CA (US); Hector A. Baldis, Pleasanton, CA (US); Chris P. J. Barty, Livermore, CA (US); David J. Gibson, Livermore, CA (US); Bernhard Rupp, Livermore, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 10/137,262

(22) Filed: Apr. 30, 2002

(65) Prior Publication Data
US 2003/0202546 A1 Oct. 30, 2003

(51) Int. Cl.[7] .................................................. H01G 3/30
(52) U.S. Cl. ................................ 372/5; 372/18; 372/2; 378/119
(58) Field of Search ................... 372/5, 18, 2; 378/119

(56) References Cited

U.S. PATENT DOCUMENTS

| | | | |
|---|---|---|---|
| 4,975,917 A | * 12/1990 | Villa | ............................. 372/5 |
| 5,353,291 A | 10/1994 | Sprangle et al. | |
| 5,654,998 A | 8/1997 | Turcu et al. | |
| 5,796,101 A | 8/1998 | Haight et al. | |
| 5,825,847 A | * 10/1998 | Ruth et al. | ................... 378/119 |
| 6,035,015 A | 3/2000 | Ruth et al. | |
| 6,097,740 A | 8/2000 | Palathingal | |
| 6,188,746 B1 | 2/2001 | Miley et al. | |
| 6,249,566 B1 | 6/2001 | Hayashi et al. | |

OTHER PUBLICATIONS

Bulyak, E., et al., "A Compact X–Ray Source Based on Compton Scattering," Proceedings of the 1999 Particle Accelerator Conference, New York, 1999, pp. 3122–3124.
Carlsten, B. E., "Calculation of the noninertial space–charge force and the coherent synchrotron radiation force for short electron bunches in circular motion using the retarded Green's function technique," Physical Review E, vol. 54, No. 1, Jul. 1996, pp. 838–845.
Huang, Z., "Generation of Intense X–Rays and Low–Emittance Electron Beams in a Laser–Electron Storage Ring," Argonne National Laboratory, Argonne, Illinois, submitted to World Scientific on Mar. 8, 2000, pp. 1–9.
Huang, Z., et al, "Laser–Electron Storage Ring," Physical Review Letters, vol. 80, No. 5, Feb. 2, 1998, pp. 976–979.
Hartemann, F. V., et al., "Three–Dimensional Theory of Emittance in Compton Scattering and X–Ray Protein Crystallography," Lawrence Livermore National Laboratory, Preprint UCRL–JC–140944, Sep. 28, 2000, 95 pages.
Leemans, W.P., et al., "X–Ray Based Subpicosecond Electron Bunch Characterization Using 90$\degree$ Thompson Scattering," Physical Review Letters, vol. 77, No. 20, Nov. 11, 1996, pp. 4182–4185.

* cited by examiner

Primary Examiner—Leon Scott, Jr.
(74) Attorney, Agent, or Firm—Eddie E. Scott; Alan H. Thompson (57) ABSTRACT

A femtosecond laser-electron X-ray source. A high-brightness relativistic electron injector produces an electron beam pulse train. A system accelerates the electron beam pulse train. The femtosecond laser-electron X-ray source includes a high intra-cavity power, mode-locked laser and an x-ray optics system.

28 Claims, 8 Drawing Sheets

FEMTOSECOND LASER-ELECTRON X-RAY SOURCE

The United States Government has rights in this invention pursuant to Contract No. W-7405-ENG-48 between the United States Department of Energy and the University of California for the operation of Lawrence Livermore National Laboratory.

BACKGROUND

1. Field of Endeavor

The present invention relates to an X-ray source and more particularly to a femtosecond laser-electron X-ray source.

2. State of Technology

U.S. Pat. No. 6,035,015 for a Compton backscattered collmated X-ray source by Ronald D. Ruth, and Zhirong Huang, issued Mar. 7, 2000, and assigned to The Board of Trustees of the Leland Stanford Junior University provides the following description: "In the past two decades x-ray lithography (XRL) has been developed as an alternative to optical lithography as feature sizes of silicon chips continue to shrink according to the Moore's law (S.P.I.E. Symp. Proceedings "Electron Beam, X-ray, and Ion-Beam Submicrometer Lithographies for Manufacturing," 1990–1996). Today, optical lithography is reaching some fundamental limits, and x-ray lithography is emerging as the primary successor technology needed for future lithography development. The two biggest challenges facing x-ray lithography are perhaps the fabrication of x-ray masks and the development of the x-ray sources. While the technology of mask patterning is evolving by means of electron beam lithography and advances in material science, economical exposure sources are still lacking. At present there are three types of x-ray sources that could provide sufficient flux for a reasonable exposure time (S.P.I.E. Symp. Proceedings "Electron Beam, X-ray, and Ion-Beam Submicrometer Lithographies for Manufacturing," 1990–1996): synchrotrons, plasma-based sources, and transition radiation (TR) sources. Among these, plasma-based sources are relatively easy to obtain but have the lowest available x-ray power level and no collimation. TR sources employ moderate energy electron linacs (25 MeV to 250 MeV) to bombard a stack of thin Beryllium (Be) foils. The resulting x-ray beam is well collimated but hollow in the forward direction. Special methods of making the cross section of the x-ray beam uniform and eliminating the background radiation are needed. Synchrotrons, on the other hand, are the preferred sources because they are powerful and stable. However, in order to generate x-rays having the optimal wavelength for XRL (around 1 nm), synchrotrons operate with high-energy electron beams (around 1 GeV when using conventional magnets and even 600 MeV when using superconducting dipoles). Hence the entire system (synchrotron, injector and radiation shielding) can be very expensive and complex. In addition, special beam lenses and steppers are necessary to facilitate wafer production, which translates to a huge initial investment for manufacturers. There are a number of sources of x-rays which depend upon Compton scattering. Compton scattering is a phenomenon of elastic scattering of photons and electrons. Since both the total energy and the momentum are conserved during the process, scattered photons with much higher energy (light with much shorter wavelength) can be obtained in this way. A laser beam collides nearly head-on with and is scattered off a high energy electron beam in order to generate x-rays (or even gamma-rays) for various applications."

SUMMARY

Features and advantages of the present invention will become apparent from the following description. Applicants are providing this description, which includes drawings and examples of specific embodiments, to give a broad representation of the invention. Various changes and modifications within the spirit and scope of the invention will become apparent to those skilled in the art from this description and by practice of the invention. The scope of the invention is not intended to be limited to the particular forms disclosed and the invention covers all modifications, equivalents, and alternatives falling within the spirit and scope of the invention as defined by the claims.

The present invention provides a femtosecond laser-electron X-ray source. A high-brightness relativistic electron injector produces an electron beam pulse train. A system accelerates the electron beam pulse train. The femtosecond laser-electron X-ray source includes a high intra-cavity power, mode-locked laser and an x-ray optics system. In one embodiment the system for accelerating the electron beam pulse train includes a compact electron ring with an rf cavity. In another embodiment the system for accelerating the electron beam pulse train is a superconducting linac.

The invention is susceptible to modifications and alternative forms. Specific embodiments are shown by way of example. It is to be understood that the invention is not limited to the particular forms disclosed. The invention covers all modifications, equivalents, and alternatives falling within the spirit and scope of the invention as defined by the claims.

BRIEF DESCRIPTION OF THE DRAWINGS

The accompanying drawings, which are incorporated into and constitute a part of the specification, illustrate specific embodiments of the invention and, together with the general description of the invention given above, and the detailed description of the specific embodiments, serve to explain the principles of the invention.

DETAILED DESCRIPTION OF THE INVENTION

Referring now to the drawings, to the following detailed information, and to incorporated materials; a detailed description of the invention, including specific embodiments, is presented. The detailed description serves to explain the principles of the invention. The invention is susceptible to modifications and alternative forms. The invention is not limited to the particular forms disclosed. The invention covers all modifications, equivalents, and alternatives falling within the spirit and scope of the invention as defined by the claims.

The present invention provides a femtosecond laser-electron X-ray source. A high-brightness relativistic electron injector produces an electron beam pulse train. A system accelerates the electron beam pulse train. The femtosecond laser-electron X-ray source includes a high intra-cavity power, mode-locked laser and an x-ray optics system. In one embodiment the system for accelerating the electron beam pulse train includes a compact electron ring with an rf cavity. In another embodiment the system for accelerating the electron beam pulse train is a superconducting linac. In an embodiment the high-brightness relativistic electron injector produces a short (ps), relativistic (10–100 MeV), high-charge (nC), low emittance electron bunch train. In an embodiment the high-brightness relativistic electron injector includes an RF system, a frequency multiplier, an RF amplifier, a compact, high-brightness photoinjector, and a booster linac. In an embodiment the high intra-cavity power, mode-locked laser includes an RF system, a laser oscillator, a CW pump laser, a cyro-cooled crystal, a large-mode-area laser oscillator, an off-axis parabolae, a high-reflectivity mirror, a high-reflectivity mirror, a first chicane, and a second chicane. In an embodiment the first chicane provides bunch compression. In an embodiment the second chicane provides bunch dispersion and coherent synchrotron radiation quenching. In an embodiment the x-ray optics system re-images the micro-focus. In an embodiment a cryo-cooled active medium is provided to increase thermal conductivity. In an embodiment the cryo-cooled active medium is Ti:Sapphire. In an embodiment a microfocus X-ray source and X-ray optics is provided to re-image the micofocus. In an embodiment the x-ray optics system is a multilayer X-ray optics that partially serves to monocromatize the X-rays. In an embodiment the system for accelerating the electron beam pulse train is a superconducting linac, and the superconducting linac and the high intra-cavity power, mode-locked laser have optimally matched laser and electron pulse formats. In an embodiment the system for accelerating the electron beam pulse train is a compact electron ring with an rf cavity with an rf cavity that includes a kicker, an RF system, an RF amplifier, an rf cavity, and bend magnets. In an embodiment the rf cavity maintains the energy of the trapped bunches.

The present invention provides a femtosecond laser-electron X-ray method that includes the steps of: producing an electron beam pulse train, accelerating the electron beam pulse train, focusing and matching the electron beam pulse train into an x-ray interaction region, producing a seed laser pulse train, producing a OEW laser pulse train, focusing the OEW laser pulse train to collide with the electron beam pulse train and produce high average flux and brightness, tunable x-rays, and timing and synchronizing the electron beam pulse train and the OEW laser pulse train. In one embodiment the step of accelerating the electron beam pulse train utilizes a compact electron ring with an rf cavity. In another embodiment the step of accelerating the electron beam pulse train utilizes a superconducting linac. An embodiment includes the use of an annular layer mode allows 180° interactions with minimal timing jitter sensitivity. An embodiment includes the use of a ring pump profile in the active medium allows the production of the annular layer mode. An embodiment includes the use of a high-reflectivity coating on an X-ray window allows transmission of the X-rays and reflection of the layer light. An embodiment includes the use of chirped mirrors at the cavity end allows GVD control. An embodiment includes the use of an adequate material in the cavity allows GVD control.

Figure 1:
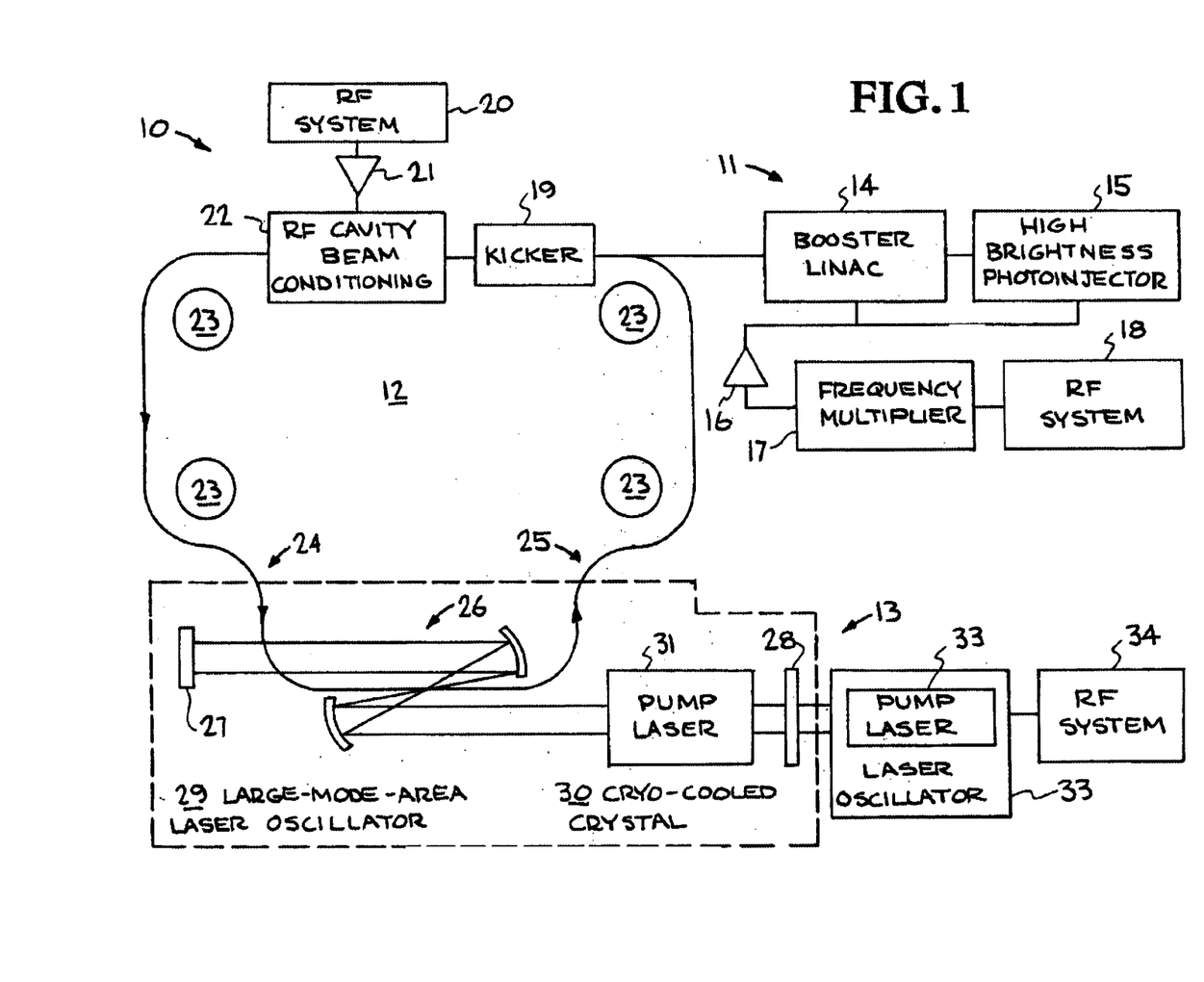
FIG. 1 illustrates a system that provides a femtosecond laser-electron x-ray source in a ring environment.

Referring now to FIG. 1, one embodiment of the present invention is illustrated. This embodiment is a system that provides a ring femtosecond laser-electron x-ray (ReFLEX) source. The system is generally designated by the reference numeral 10. Components of the system 10 include a high-brightness relativistic electron injector 11; a compact electron ring 12 with an rf cavity; and a high intra-cavity power, mode-locked laser 13. The compact electron ring 12 with an rf cavity is for beam conditioning energy loss, & dispersion & compression optics.

The system 10 provides a tunable, high-average flux x-rays and resolves the problem of low repetition rates for the laser-electron beam Compton scattering interaction, and brings the average intra-cavity laser power to the range of 0.1–50 kW, necessary to produce high-average x-ray flux to make a number of applications feasible. The system 10 also resolves the question of emittance & brightness degradation due to coherent synchrotron radiation effects in the storage ring, as well as large-area modes for extremely high laser intra-cavity powers with femtosecond pulses. The laser-electron interaction of system 10 additionally provides a cooling mechanism potentially yielding an extremely low-emittance equilibrium electron beam.

High-intensity lasers interacting with high-brightness, relativistic electron beams can produce short x-ray flashes with high peak intensities, but low average fluxes, due to the low overall repetition rate of the system (<100 Hz) and the low average power of the drive laser (<10 W). The system 10 allows the repetition rate to be as high as 100 MHz, and the average intra-cavity laser power could be scaled to 1–50 kW, thus yielding a gain of 2–4 orders of magnitude when compared to the state-of-the-art or currently planned devices.

Referring again to FIG. 1, additional details of the system 10 will be described. The high-brightness relativistic electron injector 11 includes RF system 18, frequency multiplier 17, RF amplifier 16, a compact, high-brightness photoinjector 15, and booster linac 14. The high-brightness relativistic electron injector 11 produces a short (ps), relativistic (10–100 MeV), high-charge (nC), low emittance electron bunch train. The compact ring 12 with magnetic transport and focusing optics, dispersion/compression elements includes kicker 19, RF system 20, RF amplifier 21, an rf cavity 22 to maintain the energy of the trapped bunch(es), and bend magnets 23. The high-intracavity power femtosecond laser system 13 includes RF system 34, laser oscillator 33, CW pump laser 32, cyro-cooled crystal 30, large-mode-area laser oscillator 29, off-axis parabolae 26, high-reflectivity mirror 27, high-reflectivity mirror 28, chicane 1: bunch compression 24, and chicane 2: bunch dispersion (coherent synchrotron radiation quenching) 25.

Four major components are included in the laser subsystem 13. First is the main oscillator 29, which is a standard short pulse mode-locked oscillator using a common technology such as Kerr-lens mode-locking. The active medium in this oscillator is pumped by a few-watt continuous wave (cw) laser, which is the second component of the laser system. The pulse repetition rate in any oscillator is controlled by the time it takes the laser pulse to make one complete trip through the cavity, and therefore by precisely positioning the high-reflectors on the ends of the cavity the repetition rate can be matched to the repetition rate of the electron storage ring exactly. The output of this oscillator is enlarged in the transverse direction by means of an optical telescope. The third component of the laser system will now be described. The desired goal is to have a very high laser intensity interacting with the electron beam. What limits the intensity available in an oscillator is damage in the active medium; most mode-locking mechanisms to produce short pulses require the beam diameter to be very small inside the active medium, which means that the energy must be low to protect the material. This plan circumvents that restriction by using the standard oscillator to produce the laser pulses, and then feeding those pulses into a second oscillator with a much larger beam diameter. This second oscillator (the third component of the laser system) consists of high-reflectors at each end, two off-axis parabolic mirrors to focus and re-collimate the laser for interaction with the electron beam, and an active medium to keep the energy of the beam at its peak. The active medium is again pumped by a 5–100 W laser, which is the fourth component of the system. The second is oscillator is seeded by pulses from the first oscillator coupled into the system by a mechanism such as leakage through one of the high reflectors. Again, by setting the length of the oscillator precisely, the repetition rate of the oscillator can be made to match that of the electron storage ring. The active medium in the OEW can be cryogenically cooled to increase the thermal conductivity and evacuate part of the pump energy that is converted to heat. In the case of Sapphire, the thermal conductivity @ 77° k is over one order of magnitude lighter than at room temperature.

Figure 2:
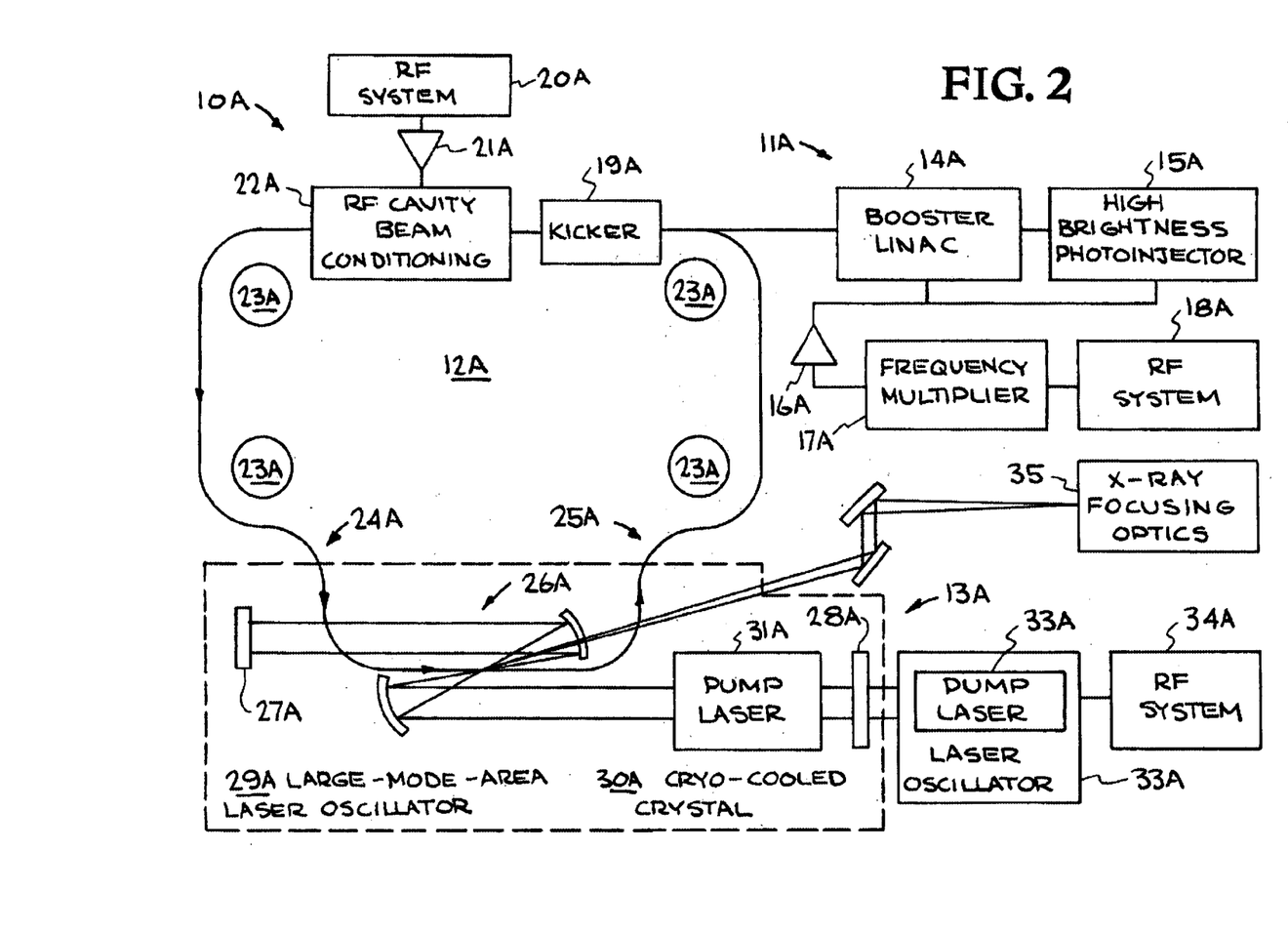
FIG. 2 illustrates another embodiment of the present invention.

Referring now to FIG. 2, a system that illustrates another embodiment of the present invention is shown. The system, generally designated by the reference numeral 10A, provides a ring femtosecond laser-electron x-ray (ReFLEX) source. Components of the system 10A include a high-brightness relativistic electron injector 11A; a compact electron ring 12A with an rf cavity for beam conditioning energy loss, & dispersion & compression optics; and a high intra-cavity power, mode-locked laser 13A. The high-brightness relativistic electron injector 11 A includes RF system 18 A, frequency multiplier 17 A, RF amplifier 16 A, a compact, high-brightness photoinjector 15 A, and booster linac 14 A. The high-brightness relativistic electron injector 11 A produces a short (ps), relativistic (10–100 MeV), high-charge (nC), low emittance electron bunch train. The compact ring 12 A with magnetic transport and focusing optics, dispersion/compression elements includes kicker 19 A, RF system 20 A, RF amplifier 21 A, an rf cavity 22 A to maintain the energy of the trapped bunch(es), and bend magnets 23 A. The high-intracavity power femtosecond laser system 13 A includes RF system 34 A, laser oscillator 33 A, CW pump laser 32 A, cyro-cooled crystal 30 A, large-mode-area laser oscillator 29 A, off-axis parabolae 26 A, high-reflectivity mirror 27 A, high-reflectivity mirror 28 A, chicane 1: bunch compression 24 A, and chicane 2: bunch dispersion (coherent synchrotron radiation quenching) 25 A.

Four major components are included in the laser subsystem 13A. First is the main oscillator 29A, which is a standard short pulse mode-locked oscillator using a common technology such as Kerr-lens mode-locking. An x-ray optics system 35 is used to monochromatize the beam and to re-image the micro-focus onto a very small area, with an extremely high peak and average x-ray flux. The system 35 also integrates the required x-ray components to monochromatize and image the x-ray beam onto a microfocus. The system 35 includes double X-ray monochromator 36.

Referring now to both FIG. 1 and FIG. 2, the operation of systems 10 and 10A will be described. The ring femtosecond laser-electron x-ray (ReFLEX) sources 10 and 10A will produce high-average flux, tunable, femtosecond, monochromatic x-rays and combines high-brightness, relativistic electron accelerator technology and diode-pumped solid-state laser (DPSSL) technology. The expected flux gain from the ring femtosecond laser-electron x-ray (ReFLEX) sources 10 and 10A is 2–4 orders of magnitude above the current state-of-the-art. In addition, the size of the x-ray sources 10 and 10A is very small (3–20 $\mu$m). The tunable, monochromatic x-rays are produced via the Compton scattering interaction, and both the electron beam and the laser pulses are recycled at very high repetition rate (around 100 MHz). The laser & rf systems are fully synchronized by using the same rf clock, which mode-locks the laser, and drives the electron injector and the cavity in the storage ring. Both beams can be optimized via feedback, as the pulses are recycled at high repetition rate.

The potentially serious problem of coherent synchrotron radiation and emittance degradation in the electron ring is alleviated by a combination of cutoff quenching and dispersion-compression of the beam around the x-ray interaction region. The use of a large mode area laser system resolves the problem of extremely high laser intra-cavity powers with femtosecond pulses. Additionally, the laser-electron interaction provides a cooling mechanism yielding an extremely low-emittance equilibrium electron beam. The systems 10 and 10A also incorporates the micro-MAD ($\mu$MAD) concept, whereby a tunable, micro-focus x-ray source is used to illuminate micro-crystals, which are easier and faster to grow, and of considerably better quality for diffraction; in particular, the mosaicity is low, and is matched by the low angular divergence of the ReFLEX source. Furthermore, the micro-crystals are more easily cooled at liquid nitrogen temperatures to minimize radiation damage.

The ring femtosecond laser-electron x-ray (REFLEX) sources 10 and 10A have a wide variety of uses. One example is x-ray crystallography of proteins. X-ray crystallography can be use to establish the molecular architecture of proteins. Knowledge of the three-dimensional structure of a given protein is an essential prerequisite for fully understanding the chemical basis of the catalytic mechanism of an enzyme and for interpreting the way signal transduction proteins interact with their target molecules. There are benefits of the application of the ReFLEX sources (a.k.a. minitron) to protein crystallography. The high average flux, tunability, and micro-focus combined with efficient x-ray optics results in a unique advanced x-ray source optimally suited for protein (macromolecular) crystallography. Due to the low resolution of protein diffraction data, direct determination of the phases necessary for reconstruction of the atomic structure of the molecule is generally not possible. The experimental phase information based on the intensity differences of heavy metal derivatives or from anomalous scatterers is needed to solve the phase problem.

The present thrust in Structural Genomics (determination of molecular structure on a genome scale) as evidenced by commercial investment and increasing public funding (NIH) has only been possible due to the availability of tunable high brilliance X-ray sources. At the current state, the sole viable source for tunable high brilliance X-rays are synchrotron facilities, which exist at few selected locations in the US and world-wide and represent large-scale investments in the billion dollar range, with individual beam line optics alone amounting to several million dollars. Subscription rate for the protein crystallography beam lines is correspondingly high, and the need for a competitive alternative to synchrotron sources is evident.

A particularly attractive feature of the ReFLEX source is the small, high flux focus size allowing to use crystals in the 10 micron range, which again is so far a domain of synchrotrons, and not achievable with conventional laboratory x-ray sources. Smaller crystals often diffract better and can be grown easier and faster. In view of the fact that protein supply rather than crystallization can become a limiting factor in high throughput crystallography, the small focus size ranks equally with the tunability of the source. Combination of tunability, micro-focus, and advanced, highly efficient X-ray optics creates a revolutionary X-ray system. At a proposed cost of 2–4 $M it will be a powerful alternative to the centralized synchrotron facilities.

Other examples of use of the system 10 include: structural genomics; macromolecules using multi-wavelength anomalous diffraction (MAD); all anomalous diffraction techniques; MIR/SAD; the Human Genome Project; advanced medical & biomedical imaging; x-ray phase contrast enhancement; phototherapy; high-contrast, high-resolution imaging & radiation therapy; imaging of tagged monoclonal antibody; femtosecond material physics & science; XSAF; shocks, pump-probe x-ray experiments; semiconductor manufacture; and stockpile stewardship.

Figure 3A:
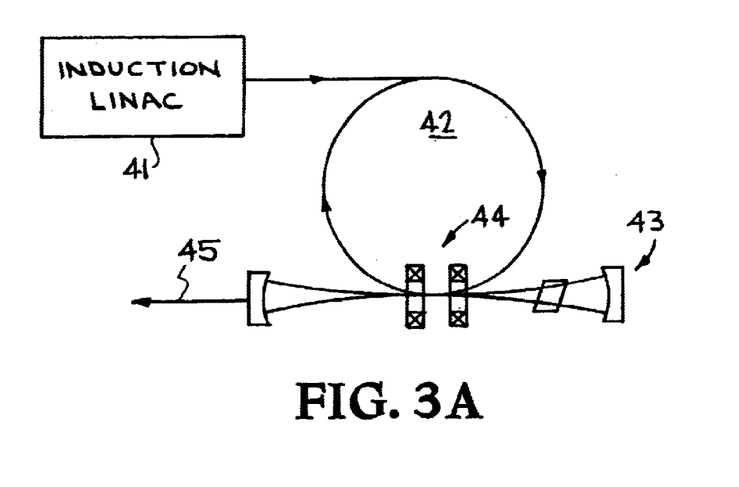
FIGS. 3A and 3B illustrate a system for producing high-average flux, tunable, femtosecond, monochromatic x-rays.
Figure 3B:
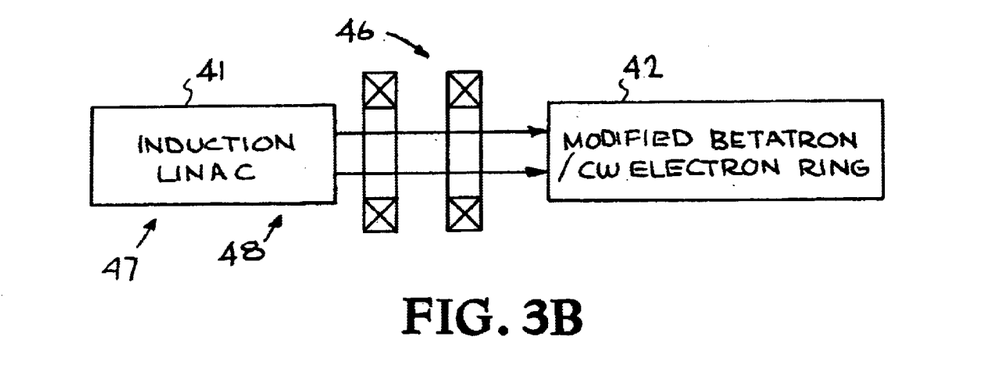

Referring now to FIGS. 3A and 3B, a system that illustrates another embodiment of the present invention is illustrated. The system, generally designated by the reference numeral 40, provides a ring femtosecond laser-electron x-ray (ReFLEX) source. The system 40 will produce high-average flux, tunable, femtosecond, monochromatic x-rays. It combines high-brightness, relativistic electron accelerator technology and diode-pumped solid-state laser (DPSSL) technology.

Referring now to FIG. 3A components of the system 40 will now be described. An induction linac 41 is operatively connected to CW electron ring 42. Alternatively, induction linac 41 can be operatively connected to a modified Betatron 42. An active medium 43 is provided. The high intracavity power laser oscillator and the electron ring interact continuously, producing a cw x-ray beam. Focusing 44 provides X-rays 45. Referring now to FIG. 3B, an electron gun 47 and emittance selection section 48 are included in induction linac 41. A booster linac 46 is connected to induction linac 41. The output of booster linac 46 is directed to the CW electron ring or modified Betatron 42.

Using LIGO technology, optical resonators with extremely high finesses are designed; with a 100 W cw pump laser, and a lasing efficiency of 50%, 50 W of losses can be supported in a cw laser oscillator. If the total losses in the cavity reach 0.1%, this translates into 50 kW of intracavity power; for 0.01%, one could obtain half a megawatt. The main losses are due to the contribution of diffraction, surface heating and residual transmission through the mirrors. Because the cavity is operated in cw mode, the laser spectrum is extremely narrow, and the optics can be designed with high precision to minimize losses.

The pump power can also be increased because the heating of the active medium can be alleviated by increasing its thermal conductivity by operating at cryogenic temperatures. In the case of Titanium:Sapphire, the thermal conductivity of the Sapphire matrix can be increased by over two orders of magnitude by operating near 30° K, which corresponds to the boiling point of liquid Neon; at 77° K, the gain in thermal conductivity is still very close to two orders of magnitudes. This temperature is easily reached by using liquid Nitrogen, which is cheap and a good coolant. By operating below the temperature for maximum thermal conductivity, one benefits from increased stability, as local heating results in an increase of the thermal conductivity, thus alleviating the risk of thermal runaways.

The use of a purely cw electron storage ring has a number of potential advantages over the storage of a train of high-brightness electron bunches. First, the cw electron ring will produce much less coherent synchrotron radiation, as is contains no microbunches capable of radiating coherently at short wavelengths. Second, no synchronization is necessary; the high intracavity power laser oscillator and the electron ring interact continuously, producing a cw x-ray beam. Third, the cw x-ray beam is also favorable for the crystallography of fragile macromolecules, such as proteins, as thermal and radiation damage problems are minimized. Fourth, the cw nature of both the laser and electron beams potentially yields the narrowest spectral bandwidth for the x-rays; this translates into an increased brightness, and the high spectral purity is favorable to multiwavelength anomalous diffraction (MAD) phasing method. It might also eliminate the need of an x-ray monochromator, when used in conjunction with a new phasing technique using wider bandwidth than the original MAD technique. Fifth, this approach eliminates the complexities of chirped-pulse amplification (CPA), including the lossy gratings, and the demanding timing of various components, such as electrooptic shutters. Finally, calculations indicate that a cw electron beam current of 0.1–1 A would be sufficient to produce the required average x-ray flux, for 50 kW of intracavity power and an interaction focus in the 20–50 $\mu$m range.

To produce and store a cw electron beam with an energy in the 10–30 MeV range, with sufficient beam quality, the compact induction linac 41 is used to produce a high-current beam (100's of Amperes), with an energy in the MeV range, and a duration of a few tens of nanoseconds. This beam is longer than the ring, and therefore adequate to fill it. The core emittance of the beam is sufficiently low, and an emittance selection device is inserted to transmit a high-quality beamlet of a few Amperes, which is subsequently boosted by a few induction cells, and injected into the ring. Different types of emittance slicing approaches can be employed: for example, a narrow beamline, with an applied magnetic field, can be used to transmit only those electron with a transverse momentum small enough that their gyro-radius is smaller than the aperture of the beam pipe. In the case of a modified betatron, the maximum current density attainable depends critically on the injection energy; it scales as $(\beta\gamma)^3$, where this quantity is related to the injection voltage, V, as follows:

$$\gamma = 1 + eV/m_0 c^2 = 1 + (V/511 \ kV), \text{ and } \beta = \sqrt{1-\gamma^{-2}}.$$

As a result, injection of a high-quality beam with energies of a few MeVs into the ring ensures that high current densities can be reached, yielding efficient x-ray production at the interaction point. Once the beam is injected and trapped, the modified betatron magnetic field is varied to bring the beam energy to the desired value. For a nominal energy of 20

MeV, relatively low magnetic fields can be used, in the 1–10 kG range. Induction linac technology is also attractive because of its reliability, and relative simplicity; in particular, it eliminates the costly and complex rf systems used for photoinjectors and rf linacs.

1. Production of the electron beam pulse train,
2. Acceleration of the electron beam pulse train,
3. Focusing and matching of the electron beam into the x-ray interaction region,
4. Production of the seed laser pulse train,
5. Production of the OEW laser pulse train,
6. Focusing of the OEW pulse train to collide with the electron bunches and produce high average flux and brightness, tunable x-rays, and
7. Overall timing and synchronization of the electron beam and laser pulses.

Figure 4A:
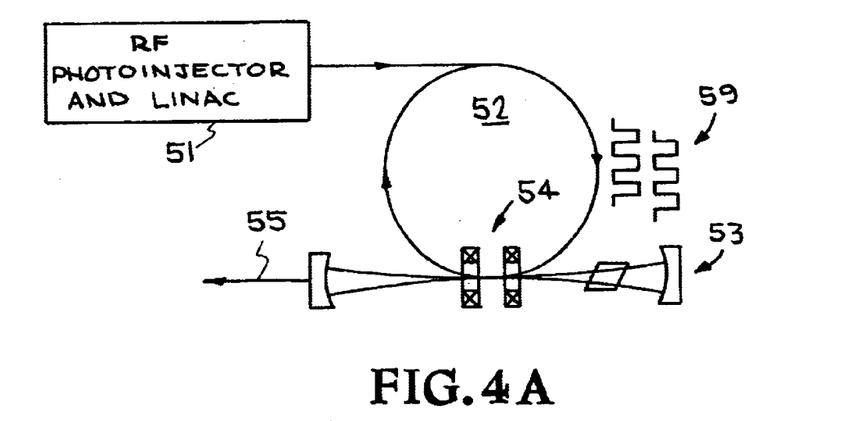
FIGS. 4A and 4B illustrate another embodiment of the invention.
Figure 4B:
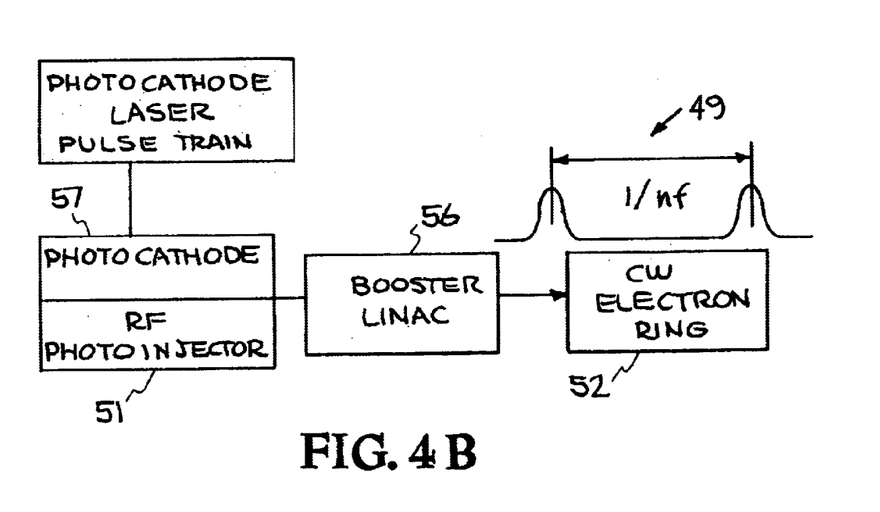

To further and better illustrate the operation of the high average flux and brightness x-ray source 100, typical operating steps are described. The basic operating steps of the system 100 include the following:

Step 1: The photoelectron pulse train is produced by illuminating a high quantum. Referring now to FIGS. 4A and 4B, a system that illustrates another embodiment of the present invention is illustrated. The system is generally designated by the reference numeral 50. An rf photoinjector 51 is used with an unusual pulse format: low-current (1–10 A) bunches are produced at a subharmonic of the rf signal, boosted in energy by a compact linac 56, and injected and trapped in the ring; the process is repeated until a cw equilibrium is reached, where the ring is filled. This technique yields high-quality beams, and the coherent synchrotron radiation problem is alleviated by the cw character of the electron beam at equilibrium. The series of low energy laser pulses on the photocathode can be produced by optical multiplexing, or by multipass amplification of a pulse train from the photocathode laser oscillator; high quantum efficiency (QE) materials, such as Cesium Telluride, can also be used for the photocathode, thus relaxing the photocathode laser requirements.

A RF photoinjector & linac 51 is operatively connected to CW electron ring 52. An active medium 53 is provided. The high intracavity power laser oscillator and the electron ring interact continuously, producing a cw x-ray beam. Focusing 54 provides X-rays 55. The output of booster linac 56 is directed to the CW electron ring 52.

The electron ring configurations discussed above, are more difficult to implement than linear systems, as questions such as orbit stability, lattice design, electron beam instabilities, and lifetime, must be carefully addressed in a complete design. Therefore, two different alternative approaches are described where the energy of the electron beam produced by a linear system is extracted and recycled after interaction with the laser beam in a high intracavity power cw oscillator, which may either be modelocked, or truly cw, depending upon the pulse format of the incident electron beam. Such linear configurations may offer more simplicity of implementation than their ring counterparts, while the energy recovery schemes discussed here greatly improve the overall efficiency of the corresponding compact, tunable x-ray source. Two main different configurations are claimed: a high repetition rate induction linac, with energy recovery using reverse induction cells, and a superconducting rf linac, with either a high QE photocathode, or an oscillator geometry where the metal photocathode is used as a mirror. In the case of the induction linac approach, the basic principle of operation of the accelerator is to use a pulsed magnetic field, which induces an accelerating potential; the electron beam is essentially the secondary of a transformer, while the induction core is the primary.

Figure 5:
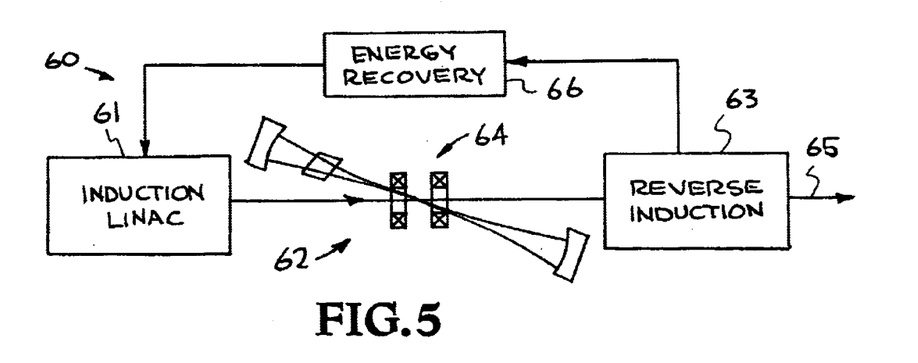
FIG. 5 shows an induction linac operatively connected to a high intracavity power CW laser oscillator.

Referring now to FIG. 5, a system that illustrates another embodiment of the present invention is illustrated. The system is generally designated by the reference numeral 60. Induction linac 61 is operatively connected to high intercavity power CW laser oscillator 62. A focusing section 64 and reverse induction section 63 are included. To extract energy from the electron beam in the reverse induction cell(s) 63, the beam now acts as the primary, and induces a voltage pulse across the induction coil, which can be then recycled through an electronic circuit. To obtain an efficient energy balance, the impedance of the electron beam and induction cells must be matched properly to minimize reflected power; typically, this implies operation at high current for the electron beam. Since the x-ray production is a small perturbation on the electron beam, high-current operation does not pose any serious problem, as the laser focus can be matched with the emittance core of the beam, where the phase space corresponds to a high-quality beam. The energy recovery scheme for the rf linac is the coherent synchrotron radiation produced by the electron bunch, after the Compton scattering interaction, in the appropriate rf structure.

Figure 6A:
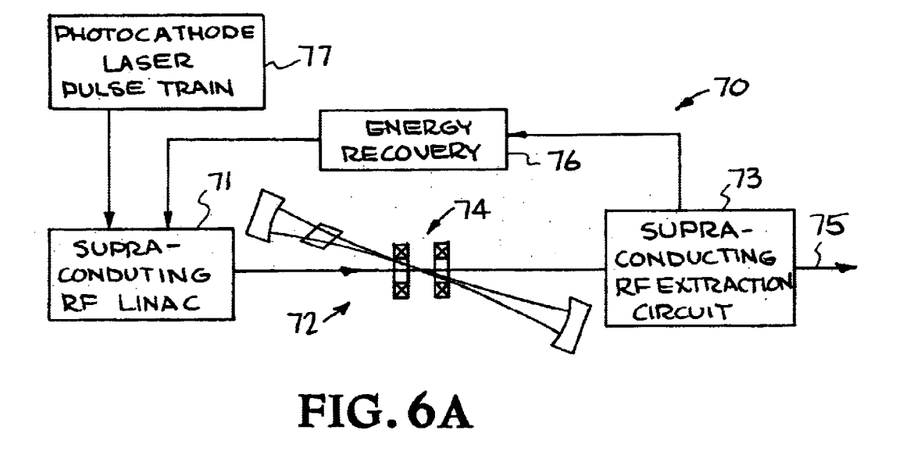
FIGS. 6A and 6B show a supraconducting RF linac operatively connected to high intercavity power CW mode-locked laser oscillator.
Figure 6B:
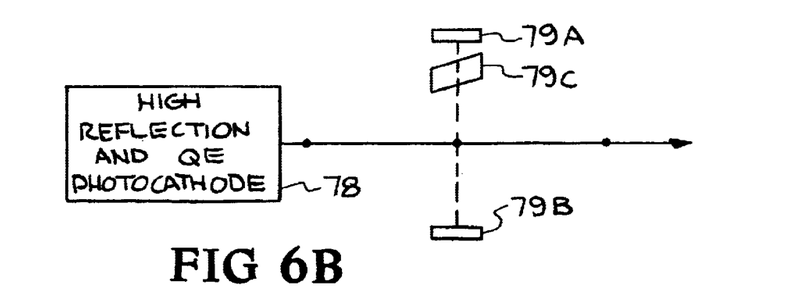

Referring now to FIGS. 6A and 6B, a system that illustrates another embodiment of the present invention is shown. The system is generally designated by the reference numeral 70. Superconducting RF linac 71 is operatively connected to high intercavity power CW mode-locked laser oscillator 72. A focusing section 74 and superconducting RF extraction circuit 73 are included. The use of a superconducting linac is required to eliminate the problem of energy dissipation in the rf structures, which would otherwise severely limit the overall system performance. A cw or quasi-cw electrostatic accelerator and a multistage depressed collector, could also be implemented. The appropriate energy range (nominally 20 MeV) would need to be reached.

Figure 7:
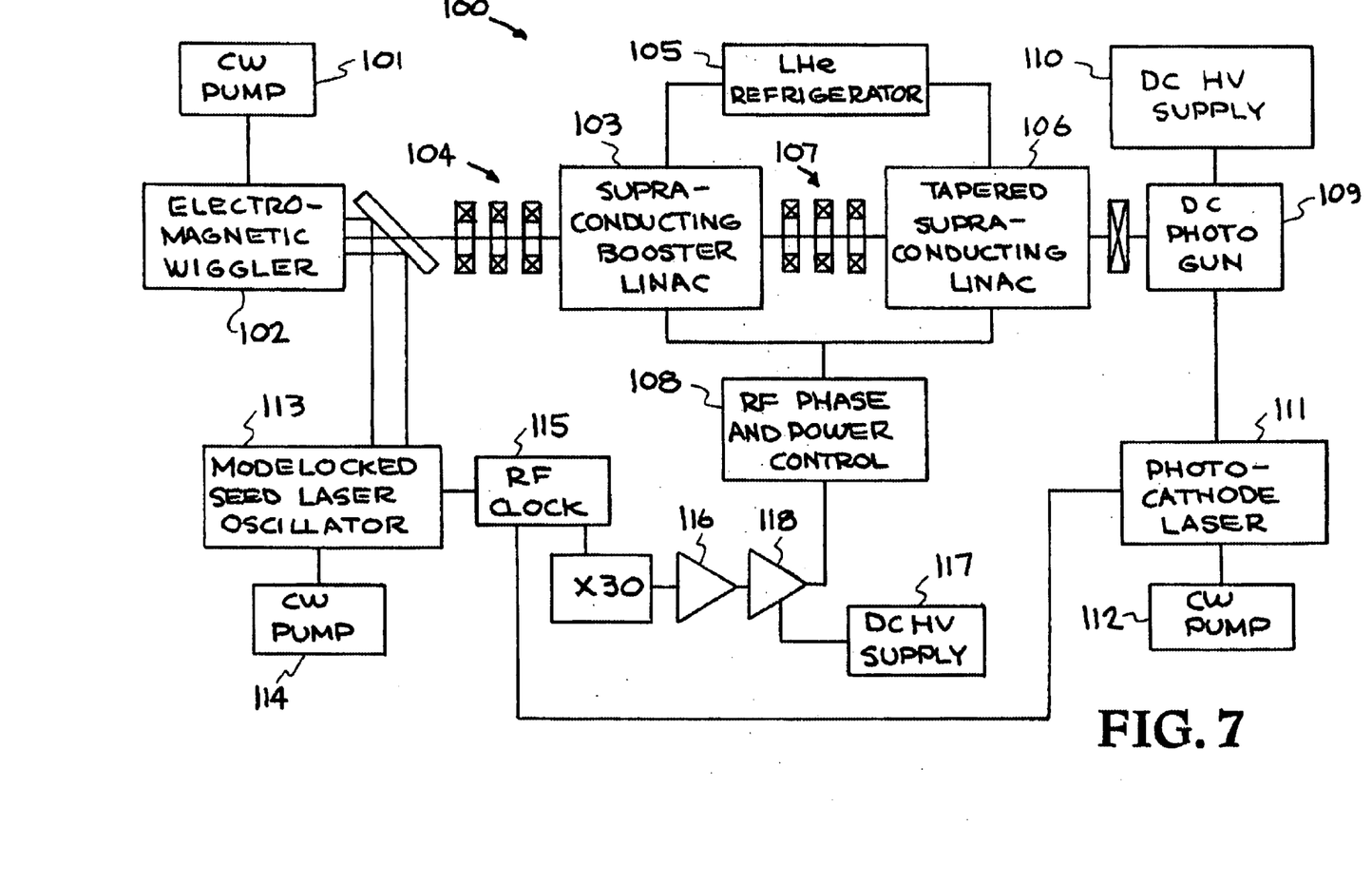
FIG. 7 shows a high average brightness x-ray source using a supra-conducting rf linac and a high intracavity power optical electromagnetic wiggler.

Referring now to FIG. 7, a system that illustrates another embodiment of the present invention is shown. The system is identified by the acronym SupraFLEX (superconducting femtosecond laser-electron x-ray source) and is generally designated by the reference numeral 100. Components of the system 100 include CW pump 10–100W 101, electromagnetic wiggler 50 MHz, 1 mJ, 50 kW 102, superconducting booster linac 10–20/25 MeV 103, focusing quads 104, LHe Refrigerator 105, tapered superconducting linac 0.3–10 MeV 106, matching quads 107, RF phase & power control 108, DC PhotoGun 109, DC HV supply 300 kV 1-mA 110, photocathode laser 111, CW pump 5W 112, mode-locked seed laser oscillator 113, CW pump 5W 114, RF clock 50 MHz 115, TWT 116, DC HV supply 50 kV 10A 117, and CW klystron 1.5 GHz 100–200 kW 118. The system 100 is a high average brightness x-ray source using a superconducting rf linac and a high intracavity power optical electromagnetic wiggler (OEW). The system 100 can operate at a repetition rate in the 10–100 MHz range, and the overall device can be operated with or without re-circulation of the electron beam, and with or without energy recovery from the spent electron beam. FIG. 7 represents a general schematic of the SupraFLEX source 100, identifying its main subsystems and components.

To further and better illustrate the operation of the high average flux and brightness x-ray source 100, typical operating parameters are described; however, these are used only as and indication, and should not be construed as a limitation for potential device performance. The basic operations of the system include the following.

Efficiency (QE), prompt (sub-picosecond response time) photocathode with a laser pulse train via the photo-electric effect. For the purpose of illustration, we will assume a QE, σ, of 5%, and a photo-emission threshold, or work function, w, of 3 eV; the laser pulse energy, $E_p$, required to produce a photoelectron bunch of charge q, is:

$$E_p = \frac{qw}{e\sigma};$$

this translates into $E_p$=3 nJ for q=50 pC. The corresponding laser power required to produce a continuous wave (cw) pulse train with a repetition rate, f, is: $<P_p>=fE_p$, or $<P_p>=$ 0.15 W for f=50 MHz. In addition, it should be noted that for some photocathode materials, the work function is sufficiently low to allow the use of a low photon energy laser, such as Titanium:Sapphire, which has a central operating wavelength of 795 nm, and a corresponding photon energy hc/eλ=1.556 eV.

In the case of a 3 eV threshold, quoted above, frequency doubling would yield the required photon energy at 3.112 eV. The other important requirement on the photocathode laser pulse is that their duration much be small enough to produce short electron bunches. A typical operating number of $\Delta t_p$=1 ps, will yield the desired photoelectron bunch train; the corresponding peak laser power is: $\hat{P}_p=E_p/\Delta t_p$=3 kW. To pre-accelerate the photoelectrons prior to energy boosting in the linac, a dc electric field is applied on the photocathode; a typical value for the dc accelerating voltage is $V_{dc}$=300 kV; to estimate the power required from the dc high voltage (HV) supply, derive the average current of the electron pulse train:

$$<I_b>=fq=2.5 \ mA,$$

for the parameters introduced above to illustrate this discussion. The dc power of the HV gun supply is therefore: $V_{dc}<I_b>$=750 W.

The peak current of the photoelectron pulse train: $\hat{I}_b$=q/$\Delta t_p$=50 A can be estimates. The dc gun must also be carefully designed to minimize the normalized transverse emittance, ε, and the energy spread, Δγ/γ, of the electron beam; typical acceptable numbers for the emittance are in the 1–10 mm.mrad range, while relative energy spread in the 0.1–0.5% range are adequate.

Step 2: Once the photoelectron pulse train is produced, the beam must be quickly accelerated to minimize emittance and energy spread growths, which are induced by the space-charge of the bunches. The proper technology should be chosen considering that the device essentially operates in the cw mode and that the final beam energy is dictated by the wavelength of the laser used as an OEW and the desired x-ray energy, hc/eλ$_x$:

$$W \simeq \frac{m_0c^2}{e}(\gamma - 1) \simeq \frac{m_0c^2}{e}\left[\left(\frac{1}{2}\sqrt{\frac{\lambda_0}{\lambda_x}}\right) - 1\right],$$

for head-on collision, in the linear regime. For a device operating in the 10–15 keV range (1.24–0.826 Å), and using 795 nm light, the electron beam energy must lie in the 19.95–24.55 MeV. Choosing a first booster linac with a tapered phase velocity to properly match the mildly relativistic beam produced by the dc gun, and bringing the beam energy from 0.3 MeV to 10 MeV, the power used by the electron beam is only $$P_1=\Delta E <I_b>=24.25 \ kW$$

However, in conventional linacs, the rf power required to achieve an accelerating gradient in the 10–20 MeV/m range is considerable; typically, tens of MW would be necessary to reach the aforementioned energy gain.

Recently developed technology of supraconducting accelerators can be used. In such devices, the accelerating cavities are made of Niobium, which is superconducting at liquid Helium temperature; thus all rf ohmic losses disappear, and the Q (or quality factor) of the cavities is only limited by diffraction losses. Typical Q-values in the $10^9$–$10^{10}$ range are achieved at frequencies in L-band and the lower part of the S-band range. In terms of rf power, only the beam loading must be compensated for in a supraconducting linac; therefore, the total rf power required to bring the cw electron beam to the desired energy of 25 MeV is of the order of 62.5 kW. High-power klystron generating cw powers well in excess of the number discussed above are commercially available items. The ancillary systems, including the dc HV supply energizing the klystron gun, and the traveling-wave tube amplifier (TWTA) required to boost the rf power from a few mW to a few tens of W, are also standard commercial items. As the cw rf power requirements are relatively modest, electron beam re-circulation, and other energy recovery schemes are not mandatory; this translates into a considerably simpler system. The system that is essentially linear, which has the favorable circumstance of minimizing coherent synchrotron radiation losses, which are well-known to occur for high-charge, short-duration electron bunches, and to adversely affect the quality of the electron bunches. In particular, such effect increase the beam emittance, as well as its energy spread, and induce undesirable, asymmetric, head-to-tail radiation reaction effects. In the system 100 these effects are minimized by adopting a very simple, linear electron beamline.

For a well-designed cryogenic system, employing liquid Nitrogen (LN$_2$, 77° K) and liquid Helium (LHe) cooling, good radiation shields, and long thermal conduction paths, the thermal losses at LHe temperature, near 4° K, can be very small, in the mW–W range, thus requiring a fairly modest refrigerator. Therefore, cryogenic accelerator technology allows for the acceleration of the cw photoelectron bunch train from 0.3 MeV to the desired operating energy range (20–25 MeV) with a small-scale rf system, and a relatively modest cryogenic cooling system. The operating gradient, in the 10–20 MeV/m range, also translates into a relatively compact size for the device.

Step 3: After acceleration from the dc gun to the operating energy, the beam must be focused and matched into the Compton scattering interaction region. This is achieved by a combination of magnets, including a quadrupole triplet for focusing, and steering dipoles for beam pointing and centering. Because the photoelectron bunches are short, in the picosecond range, electron pulse compression is not required, but could be implemented by using a chicane, comprised of 4 dipoles. Since the purpose of the device described here is to maximize the average x-ray brightness produced using the Compton scattering interaction, the design and integration of the focusing and matching electron beam optics can be specifically optimized in order to minimize emittance growth and energy spread increase due to space-charge and chromatic effects. The simple, linear beamline used in system 100, is extremely favorable to maintain an extremely high beam quality prior to the Compton scattering interaction, thus maximizing the x-ray yield and brightness. Typical parameters for the electron beam include an energy in the 20–25 MeV range, a relative energy spread as low as 0.1%, a normalized transverse emittance in the 5–10 π-mm.mrad range, a charge of 50 pC, a repetition rate of 50 MHz, a peak current of 50 A, with a pulse duration of 1 ps. At focus, the electron beam spot size can be in the 10–50 μm range, with 20 μm representing a good compromise between the complexity of the focusing system and the x-ray brightness.

Step 4: We now turn our attention to the laser system, which is used to produce both the photoelectron beam and the drive laser pulses trapped in the high intracavity power oscillator used as an OEW to produce the x-rays. In order to achieve efficient x-ray production via Compton scattering, the electron and photon densities must be as high as possible at the interaction point (IP). This is qualified as follows: the laser pulse must remain in the linear regime to produce high-quality x-rays, or specific spatial and temporal pulse shaping techniques must be applied in order to maintain the laser radiation pressure nearly constant during the interaction. This implies that a circularly polarized laser pulse should be used at extremely high intensities; at lower intensities, in the linear regime, linearly polarized laser pulse are also suitable. For visible wavelengths, the separation between the aforementioned linear and nonlinear scattering regimes lies near $10^{18}$ W/cm$^2$ peak intensities.

Returning to the question of efficient Compton scattering, the practical approach to reach high densities is to us short electron and laser pulses that are focused to small spot sizes. It has been previously explained how the use of a dc photoelectron gun, in conjunction with a supraconducting linac, leads to the production of a stable, high-quality, electron pulse train with duration in the picosecond range and a repetition rate of a few tens of MHz. The laser system used to illuminate the photocathode and to seed, in a synchronized manner, the high intracavity power laser used as an OEW will be discussed in some detail. Short laser pulses are required to produce sufficiently high photon densities at the IP, and an ultrashort pulse laser oscillator, such as a Kerr-lens mode-locked Ti:Sapphire system, or an externally mode-locked, sub-picosecond laser oscillator, with repetition rate at a sub-harmonic of the supraconducting linac operating frequency are adequate. The key requirements, in terms of system 100 described here, are: excellent temporal beam structure and stability, excellent mode quality, and sufficient output power (in the 0.1–1 W cw average). Commercially available systems, or slightly modified versions thereof would provide an adequate light source for the laser systems. Because of the very stringent requirements in terms of temporal synchronization between the photocathode laser, supraconducting linac, and drive laser pulses in the high intracavity power oscillator, the laser oscillator can be used to produce the low-frequency rf signal from which all other rf signals are produced via high-stability frequency multipliers, low-noise amplifier, and accurate phase shifters.

Another embodiment uses an external rf clock to modelock the laser oscillator. The oscillator can drive both the OEW cavity and the photocathode laser system. However, for the sake of flexibility, especially if one uses a higher-order mode in the OEW, a two-oscillator configuration is also possible, in which case, one oscillator can be slaved to the other, or where both oscillators can be modelocked to the same external rf clock.

The rf signal, which is either produced by an external clock, or by the master laser oscillator, by sampling the light pulse train on a fast photodiode and using filtering electronics to isolate the fundamental wave, is frequency-multiplied by a low-noise device, such as a phase-locked dielectric resonance oscillator (PDRO), which produces a higher frequency signal, with a phase that faithfully reproduces that of the laser oscillator. A traveling-wave amplifier (TWTA) can then be used to bring the signal from the mW range up to a few kW and drive the cw klystron(s) used to energize the supraconducting linac. In this manner, the rf wave used to accelerate the photoelectron bunch trains is in phase with the laser pulse train produced by the master oscillator. Furthermore, this light pulse train can be used directly on the high QE photocathode to generate the photoelectrons to be accelerated in the cw linac, thus ensuring the excellent phase stability and synchronization required for efficient x-ray production at the IP. Another embodiment uses part of the master laser oscillator pulse train to seed a slave oscillator, which is dedicated to producing optimized pulse to illuminate the photocathode. This second approach may prove most useful when the laser modes used in the OEW and on the photocathode, as well as their temporal shapes are different.

The main role of the master laser oscillator is to produce seed pulses that are injected into the high intracavity power oscillator used as an OEW to stimulate Compton scattering at the IP. Two main types of laser modes can be used depending on the exact configuration of the OEW. On the one hand, for on-axis collisions, which minimize the timing jitter requirements, a hollow, or annular laser mode is required in order to decouple the laser, x-rays, and electron beam. For off-axis collisions, a conventional Gaussian mode in a stable cavity will be sufficient. Therefore, the master laser oscillator must produce the correct mode, in order to seed the large-area mode in the high intracavity power oscillator. This can be achieved by a combination of techniques, including the geometry of the pump beam, as well as the design of the oscillator cavity, which can select the proper mode. The fundamental reason for having a separate seed oscillator resides in the fact that certain modelocking mechanisms, such as Kerr-lens modelocking, rely on nonlinear interactions in the oscillator active medium, which ultimately limit the size of the operating mode in the cavity, and consequently limit the maximum intracavity power than can be safely reached in the system. One solution consists in seeding a second oscillator, operating with a large-area mode, and capable of sustaining very high intracavity powers, in the tens of kW range (average) as opposed to a few Watts for most ultrashort pulse oscillators. Therefore, the master laser oscillator produces a well-synchronized, stable light pulse train at relatively low power (in the Watt range), with a clean mode profile adequate to seed the high intracavity power oscillator, which is discussed in the next section. Furthermore, the master laser oscillator can also seed the photocathode laser system and provide a stable rf reference signal.

Step 5: a mechanism is used to produce the high intracavity power laser pulses used as an OEW to stimulate Compton scattering at the IP with the incoming cw photoelectron pulse train. Details about the focusing and matching of the high power laser pulses in the OEW are exposed will follow.

As explained above, in order to achieve the maximum cw average intracavity power in the OEW, it is necessary to excite and sustain a mode with a large area, to minimize nonlinear effects that would limit the laser power available at the IP. Therefore, instead of using a single oscillator, the functionalities are split into a master seed oscillator presented in the previous section, and a high intracavity power system.

The main elements of the high intracavity power laser oscillator include very high reflectivity mirrors to trap the seed pulse (train) injected from the master laser oscillator, and an active medium, optically pumped externally, to compensate for the cavity losses and amplify the seed power to the maximum possible level. Because the cavity must have extremely low losses, simplicity is important to minimize the sources of loss in the device.

There are at least 3 distinct sources of loss in the high intracavity power oscillator: diffraction, absorption, and stray reflections. Diffraction can be minimized by keeping the laser mode size substantially smaller than all the optical elements inserted in the device. The mirrors can be coated with extremely high-reflection coatings, similar to those developed for LIGO technology, and obtain >99.99% reflectivity in the optical bandwidth of the system.

This is further simplified if one uses relatively long laser pulses, in the 100 fs–2 ps range, because the reduced optical bandwidth translates into more easily matched and designed high-reflectivity coatings for the mirrors, and ant-reflection (AR) coatings for other optical elements. Absorption can be minimized by carefully selecting the optical elements required in the cavity; in fact the only elements that are absolutely necessary are an externally pumped active medium, such as a Titanium:Sapphire crystal, which can be AR-coated and/or cut at Brewster angle to minimize losses, and a couple of mirrors with very high reflectivity to form a stable optical resonator.

It is estimated that losses lower than 0.1% could easily be reached, with 0.01% a feasible goal with current technology. This translates into intracavity powers in the 50–500 kW range for 50 W of IR in the Titanium:Sapphire crystal and 100 W of cw pump power, assuming a demonstrated conversion efficiency of 50%. Compared to the average power achieved by laser systems used for Compton scattering, this represents a gain of 3–4 orders of magnitude, which is directly reflected in the average x-ray flux of the device. As the crystal is pumped, part of the power is dissipated as heat; however, extremely efficient cooling can be provided to the crystal, which is operated under high vacuum, by using a cryogenic coolant.

For example, in the case of Titanium:Sapphire, the Sapphire matrix has a superb thermal conductivity at LN2 temperature, and a few tens of Watts of cw average power could be removed in that way. For Sapphire the thermal conductivity at LN2 temperature is better than that of Cu at that temperature. The vacuum operation of the OEW also ensures that no windows are required in the high intracavity power cavity, thus eliminating another potential source of losses.

The cavity size is matched to the repetition rate of the master seed oscillator, and its length can be monitored, so that a piezoelectric system can be used to maintain it precisely constant. The pump power can brought in through a dichroic mirror, which also serves as a high reflectivity mirror for the cavity, as illustrated by the embodiment, generally designated by the reference numeral 200, shown in FIG. 8. Components of the system 200 include CW pump 201, 532 nm folding mirror 202, 532 nm window 203, dichroic mirror 204, AR coated Ti:sapphire crystal & $LN_2$ cooling 205, thin Be window 206, thin Be window 207, Gaussian-Bessel large area mode 208, spherical mirror 209, spherical mirror 210, 800 nm folding mirror 211, and 800 nm folding mirror 212. A vacuum window can be used to bring in the optical power used to pump the active medium in the high intracavity power cavity. The linear and nonlinear group velocity diagram (GVD) in the OEW can be controlled by using chirped high-reflectivity mirrors for the spherical mirrors or by introducing a compensating material carefully chosen to yield zero total dispersion over the laser pulse bandwidth at equilibrium.

Step 6: the focusing and matching of the laser pulses trapped in the high intracavity power OEW to collide with the cw photoelectron pulse train produced by the supraconducting linac is considered. As mentioned above, two main configurations are possible: on-axis collisions, where a hollow beam is required to separate the electron, x-ray, and laser beams, or off-axis collisions, in which case, a regular Gaussian mode is adequate. The hollow beam for on-axis collisions offers a number of advantages. A special mirror or mirror arrangement is used to focus the laser pulse at 180° incidence (head-on collision). This can reduce the requirement on the timing jitter performance of the overall system by a very large factor, varying between approximately 20 to a few hundreds, depending on the particular characteristics of the laser beam and electron bunch.

For a given electron bunch aspect ratio, that is the bunch length to radius ratio, a critical angle can be defined from 180° incidence above which the x-ray flux degradation due to timing jitter is dominated by the electron bunch length; under the critical angle, jitter requirement are dominated by the inverse beta-function of the focused electron beam. This is illustrated by the embodiment shown in FIG. 9, where the integrated dose is given as a function of timing jitter: clearly, working at 180° incidence is extremely beneficial, as the synchronization requirement between the laser pulse and the electron bunch is much easier to meet. The system is designated generally by the reference numeral 300. The system 300 illustrates interaction geometry for head-on collisions with folding IR mirror and a (Be) X-ray window. Components of the system 300 include incident converging Gaussian laser beam 301, transmitted X-rays 302, Be flat coated for high-reflectivity as laser wavelength 303, IP 304, spent electron beam turned by dipole magnet 305, and focusing electron beam 306.

Figure 9:
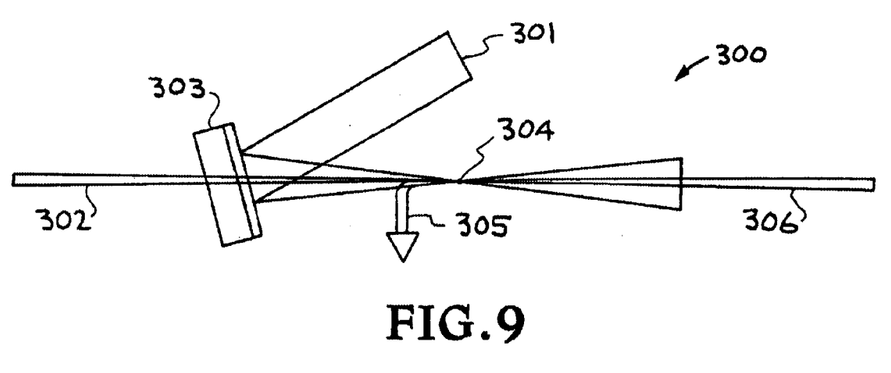
FIG. 9 illustrates interaction geometry for head-on collisions with folding IR mirror and a (Be) X-ray window, which also serves as a high-reflectivity mirror for the laser light.

The extraction of the x-rays produced by the Compton scattering interaction at 180° incidence is problematic: the x-rays are radiated in the direction of motion of the electrons, straight toward the last focusing optics for the laser. The electron bunch itself can be bent away by a dipole magnet, but the x-rays must be allowed to propagate through the optics. Two solutions are described: the first one is to use a folding mirror, positioned after the off-axis parabola, and made of a material that is reasonably transparent near the operating x-ray wavelength. For example, Beryllium (Be, Z=4) will work well at sufficiently high photon energies, above a few keV: for example, in the case of a 1 mm-thick Be flat, a transmission of 96% is expected at 20 keV photon energy. The optical flat is then simply coated with dielectric layers to maximize the reflection of the incident laser light. Such dielectric coatings are generally very thin, and made of relatively low-Z material, such as Silicon dioxide, and should not impact x-ray transmission.

The $2^{nd}$ solution consists in using an annular laser pulse, which can be reflected and focused by an off-axis parabola with a hole in its center. This embodiment is generally designated by the reference numeral 400 shown in FIG. 10. Components of the system 400 include falcon beam 401, falcon beam 402, X-ray beam 403, off-axis parabola 404, off-axis parabola 405, bend magnet 406, focus 407, and electron beam 408.

Figure 10:
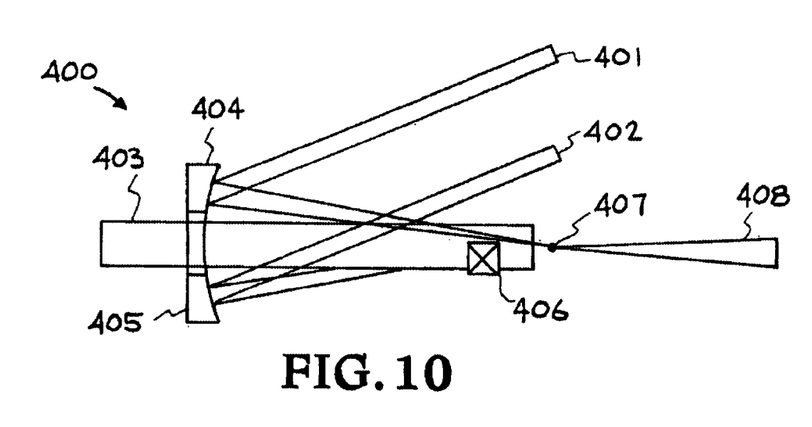
FIG. 10 illustrates an off-axis parabola with a hole in its center.

There are many advantages to this approach. First, the x-ray transmission is wavelength-independent. Second, the focusing properties of such annular beams are very favorable, as one can obtain a very small spot size without a broad incidence angle distribution; in turn this leads to higher x-ray flux, and a narrower energy spectrum for the x-rays, thus considerably increasing the overall source brightness. Third, the Rayleigh range of such a beam is longer than that obtained for the same spot size in the case of a regular Gaussian beam; this is due to the fact that the new mode is now a Bessel-Gaussian mode, which is a closer match to vacuum eigenmodes in cylindrical geometry. This property helps further simplify the timing jitter problem.

The production of annular laser beams can be achieved by using a similar transverse profile to pump the final amplifier stages of the laser system. In fact, such modes are readily available from frequency-doubled Nd:YAG lasers, and could be used to pump Titanium:Sapphire to produce the aforementioned annular laser beams.

Figure 8:
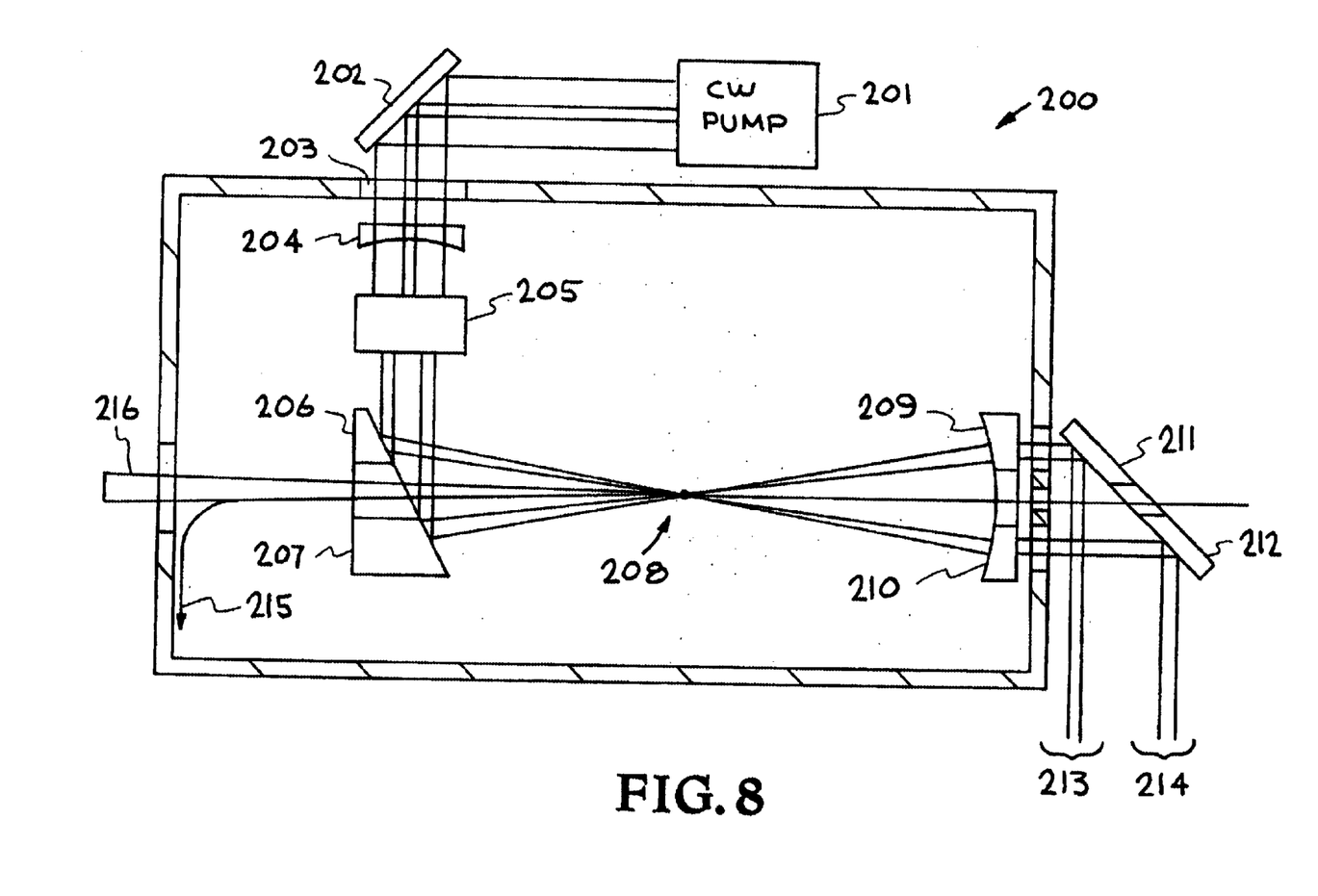
FIG. 8 shows a dichroic mirror which also serves as a high reflectivity mirror for a cavity which supports an annular laser mode used as an optical electromagnetic wiggler.

In the schematic of the OEW vacuum chamber, the x-ray extraction off-axis parabola could be replaced by a high-reflection coated Be flat, which can also be used as a vacuum window; the electron bean is simply bent away toward the beam dump by a dipole magnet. In this case, the combination of a hollow laser mode and the Be mirror discussed above results in a simplified cavity design, thus minimizing optical losses.

For both of the mode configurations discussed above, seeding is achieved by simply leaking a very small amount of power from the master seed laser oscillator into the OEW through one of the high-reflectivity mirrors at the cavity ends. Clearly, the fill time will be long, as a very small fraction of the power is coupled into the OEW; however, the active medium will amplify the signal, thus accelerating the fill process. Equilibrium is reached when the IR produced by the active medium pumped by the external cw laser system compensates the losses in the OEW; for 0.1% losses and 50 W of IR, the equilibrium intracavity power will reach 50 kW. Also note that an exceedingly small fraction of the laser power is used during the Compton scattering process. For example, if a 10 keV photon is generated, only one photon from the laser field is scattered, while the energy upshift comes at the expanse of the electron beam kinetic energy; for 20 MeV electrons, this means that the energy after the scattering event will be approximately 19.99 MeV. Therefore, the OEW laser beam depletion will represent a negligible fraction of the intracavity losses.

Step 7: a number of aspects of timing jitter and synchronization were previously discussed; here, the overall timing of the system is discussed in some detail. An essential aspect of the device described in this invention disclosure is the integration of timing and synchronization in all key components, to ensure efficient and optimized x-ray production at the IP. The master clock of the system, running around 50 MHz (for illustration) can be either the Kerr-lens mode-locked master laser oscillator, or an external, high-precision rf clock. If an external clock is used, then the master laser oscillator and the photocathode laser oscillator will be locked to that clock; if the master laser oscillator is used as the clock, the photocathode laser oscillator is slaved to it. The rf produced at the fundamental frequency is then frequency-multiplied, with a phase-coherent device, to match the operating frequency of the supraconducting linac; for the sake of illustration, a factor of 30, bringing the frequency to 1.5 GHz, can be envisioned. This signal is then pre-amplified in a low noise system, and further boosted in power by a TWTA to bring it to an adequate level to drive the cw klystron powering the linac. It is important that all these rf components be low-noise devices, with minimal phase drift and distortion, to preserve a faithful phase coherence throughout the device. Various measurements can be performed to follow the phase in the rf system, and feedback loops can be used, if necessary, to maintain an excellent phase stability. At 1.5 GHz, 1 degree of phase drifts represents approximately a 1.85 ps timing error; therefore, an overall phase stability of 0.5 degrees should be required for optimum performance. In terms of the klystron, most of the phase noise comes from electron beam voltage fluctuations inside the device, and can therefore be controlled by working with a well-designed pulse forming network (PFN); further noise reduction can be achieved by operating the tube at high efficiency, near saturation. We also note that the extremely high Q factor of the supraconducting linac accelerating rf structure will tend to stabilize the phase, as phase errors will be rejected by the extremely narrow rf frequency bandwidth of the structure. This represents another important advantage of our scheme, as compared to other approaches.

From the master seed oscillator, light pulses can be divided into 2 trains: one used to seed the high intracavity power OEW, and the other used to seed the photocathode laser system. Alternatively, the photocathode laser oscillator can simply be phase-locked to the external rf clock, or to the rf produced by the master seed oscillator. As mentioned previously, the rf signal from the master seed oscillator can be generated by using a fast photodiode monitoring a small fraction of the output light pulse train, filtering electronics, and an impedance-matching, low noise rf pre-amplifier. The optical cavity lengths of the various laser oscillators must match precisely, which will involve monitoring and feedback loops, using piezoelectric crystals for cavity length adjustment at relatively low frequency; furthermore, the cavity support frames can be build with Invar, or another material with a suitably low thermal expansion coefficient, to guarantee minimal temperature drifts. Active modelocking can also be used to further phase-synchronize the lasers and the rf system. We also note that for the high intracavity power OEW, operation under vacuum will eliminate numerous sources of instability, including air currents, speckles, dust, etc.

Table I, below, compares the average x-ray brightness of the novel source concept to the brightest sources currently available, third-generation light sources at synchrotron beamlines.

TABLE I

| Facility | ALS | APS | CryoFLEX | Jlab | BNL |
|---|---|---|---|---|---|
| Electron energy (GeV) | 1.90 | 7.00 | 0.020 | 0.048 | 0.060 |
| Average current (mA) | 100 | 2.5 | 5 | n.a. | 400 |
| Average beam power | 700 | 0.050 | 0.240 | n.a. | 760 |
| RF frequency (GHz) | 0.352 | 1.497 | 1.497 | 2.856 | 0.500 |
| Pulse duration (ps) | 170 | 1 | | 3.5 | 35–100 |
| System size (m) | 400 | 1100 | 5–10 | | |

TABLE I-continued

| System cost (M$) | 99.5 | 467 | 5 | |
|---|---|---|---|---|
| X-ray characteristics | | | | |
| Process | Bend | Bend | Compton | 2SFEL Compton |
| Critical photon energy | 3.05 | 19.5 | 12.5 | 6 |
| Source size $\sigma_x$ ($\mu$m) | 260 | 320 | 20 | 250 |
| $\sigma_y$ ($\mu$m) | 16 | 50 | 20 | 225 |
| Av. brightness | $2.26 \times 10^{15}$ | $1.97 \times 10^{15}$ | $1.59 \times 10^{11}$ | |
| Pulse duration (ps) | 35–100 | 170 | 0.5 | |
| Fig. of merit $<B_X>/<P_b>$ | 0.937 | 0.885 | 1 | |

The present invention provides a femtosecond laser-electron X-ray source. Means are provided for producing an electron beam pulse train. Means are provided for accelerating the electron beam pulse train. Means are provided for focusing and matching the electron beam pulse train into an x-ray interaction region. Means are provided for producing a seed laser pulse train. Means are provided for producing a OEW laser pulse train. Means are provided for focusing the OEW laser pulse train to collide with the electron beam pulse train and produce high average flux and brightness, tunable x-rays. Means are provided for timing and synchronizing the electron beam pulse train and the OEW laser pulse train. In one embodiment the means for accelerating the electron beam pulse train is a compact electron ring with an rf cavity. In another embodiment the means for accelerating the electron beam pulse train is a superconducting linac.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A femtosecond laser-electron X-ray source for producing high-average flux x-rays, comprising:
    a high-brightness relativistic electron injector that produces a high-brightness electron beam pulse train;
    means for accelerating said high-brightness electron beam pulse train;
    a femtosecond high intra-cavity power, mode-locked laser that produces a femtosecond high intra-cavity power laser pulse train;
    said means for accelerating said high-brightness electron beam pulse train and said femtosecond high intra-cavity power, mode-locked laser operatively connected and positioned to cause said high-brightness electron beam pulse train and said femtosecond high intra-cavity power laser pulse train to collide and produce said high-average flux x-rays; and
    an x-ray optics system operatively connected to said means for accelerating said high-brightness electron beam pulse train and said femtosecond high intra-cavity power, mode-locked laser.

2. The femtosecond laser-electron X-ray source of claim 1, wherein said means for accelerating said electron beam pulse train includes a compact electron ring with an rf cavity.

3. The femtosecond laser-electron X-ray source of claim 1, wherein said means for accelerating said electron beam pulse train is a superconducting linac.

4. The femtosecond laser-electron X-ray source of claim 1, wherein said high-brightness relativistic electron injector produces a short, relativistic, high-charge, low emittance electron bunch train.

5. The femtosecond laser-electron X-ray source of claim 1, wherein said high-brightness relativistic electron injector includes an RF system, a frequency multiplier, an RF amplifier, a compact, high-brightness photoinjector, and a booster linac.

6. The femtosecond laser-electron X-ray source of claim 1, wherein said femtosecond high intra-cavity power, mode-locked laser includes an RF system, a laser oscillator, a CW pump laser, a cyro-cooled crystal, a large-mode-area laser oscillator, an off-axis parabolae, a high-reflectivity mirror, a high-reflectivity mirror, a first chicane, and a second chicane.

7. The femtosecond laser-electron X-ray source of claim 6, wherein said first chicane provides bunch compression.

8. The femtosecond laser-electron X-ray source of claim 6, wherein said second chicane provides bunch dispersion and coherent synchrotron radiation quenching.

9. The femtosecond laser-electron X-ray source of claim 1, wherein said x-ray optics system produces a micro-focus and wherein said x-ray optics system re-images the micro-focus.

10. The femtosecond laser-electron X-ray source of claim 1, wherein said femtosecond high intra-cavity power, mode-locked laser includes a cryo-cooled active medium to increase thermal conductivity.

11. The femtosecond laser-electron X-ray source of claim 10, wherein said cryo-cooled active medium is Ti:Sapphire.

12. The femtosecond laser-electron X-ray source of claim 1, wherein said x-ray optics system includes a microfocus X-ray source that produces a microfocus and X-ray optics to re-image the micofocus.

13. The femtosecond laser-electron X-ray source of claim 1, wherein said x-ray optics system is a multilayer X-ray optics that partially serves to monocromatize the X-rays.

14. The femtosecond laser-electron X-ray source of claim 1, wherein said means for accelerating said electron beam pulse train is a superconducting linac, and wherein said superconducting linac and said femtosecond high intra-cavity power, mode-locked laser have optimally matched laser and electron pulse formats.

15. The femtosecond laser-electron X-ray source of claim 1, wherein said means for accelerating said electron beam pulse train is a compact electron ring that includes a kicker, an RF system, an RF amplifier, an rf cavity, and bend magnets.

16. The femtosecond laser-electron X-ray source of claim 15, wherein said means for accelerating said electron beam pulse train produces trapped bunches and wherein said rf cavity maintains the energy of the trapped bunches.

17. A femtosecond laser-electron X-ray source for producing high-average flux x-rays comprising:
   means for producing an electron beam pulse train,
   means for accelerating said electron beam pulse train,
   means for focusing and matching said electron beam pulse train into an x-ray interaction region,
   means for producing a seed laser pulse train,
   means utilizing said seed laser pulse train for producing an optical electromagnetic wiggler laser pulse train, said means including a femtosecond laser,
   means for focusing said optical electromagnetic wiggler laser pulse train into said x-ray interaction region to collide with said electron beam pulse train and produce high average flux and brightness, tunable x-rays, and
   means for timing and synchronizing said electron beam pulse train and said optical electromagnetic wiggler laser pulse train so that they collide and produce said high average flux x-rays.

18. The femtosecond laser-electron X-ray source of claim 17, wherein said means for accelerating said electron beam pulse train is a compact electron ring with an rf cavity.

19. The femtosecond laser-electron X-ray source of claim 17, wherein said means for accelerating said electron beam pulse train is a superconducting linac.

20. The femtosecond laser-electron X-ray source of claim 17, wherein said means for accelerating said electron beam pulse train is a superconducting linac, and wherein said superconducting linac and said means for producing a optical electromagnetic wiggler laser pulse train have optimally matched laser and electron pulse formats.

21. A femtosecond laser-electron X-ray source method of producing high average X-rays comprising the steps of:
   producing an electron beam pulse train,
   accelerating said electron beam pulse train,
   focusing and matching said electron beam pulse train into an x-ray interaction region,
   producing a seed laser pulse train,
   producing a femtosecond optical electromagnetic wiggler laser pulse train utilizing said seed laser pulse train,
   focusing said femtosecond optical electromagnetic wiggler laser pulse train into said x-ray interaction region to collide with said electron beam pulse train and produce said high average flux and brightness, tunable x-rays, and
   timing and synchronizing said electron beam pulse train and said femtosecond optical electromagnetic wiggler laser pulse train so that said electron beam pulse train and said femtosecond optical electromagnetic wiggler laser pulse train collide in said x-ray interaction region and produce said high average flux x-rays.

22. The femtosecond laser-electron X-ray source method of claim 21, wherein said step of accelerating said electron beam pulse train utilizes a compact electron ring with an rf cavity.

23. The femtosecond laser-electron X-ray source method of claim 21, wherein said step of accelerating said electron beam pulse train utilizes a superconducting linac.

24. The femtosecond laser-electron X-ray source method of claim 21, including the use of an annular layer mode allows 180° interactions with minimal timing jitter sensitivity.

25. The femtosecond laser-electron X-ray source method of claim 24 wherein the use of a ring pump profile in the active medium allows the production of said annular layer mode.

26. The femtosecond laser-electron X-ray source method of claim 21 wherein the use of a high-reflectivity coating on an X-ray window allows transmission of the X-rays and reflection of the layer light.

27. The femtosecond laser-electron X-ray source method of claim 21 of including the step of using chirped mirrors at the cavity end to allow GVD control.

28. The femtosecond laser-electron X-ray source method of claim 21 wherein the use of an adequate material in the cavity allows GVD control.

* * * * *